(12) United States Patent
Baek

(10) Patent No.: US 10,014,471 B2
(45) Date of Patent: Jul. 3, 2018

(54) MASK ASSEMBLY FOR THIN FILM DEPOSITION

(71) Applicant: Samsung Display Co., Ltd., Yongin-si (KR)

(72) Inventor: Daewon Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/238,318

(22) Filed: Aug. 16, 2016

(65) Prior Publication Data

US 2017/0179390 A1   Jun. 22, 2017

(30) Foreign Application Priority Data

Dec. 22, 2015   (KR) .................. 10-2015-0184070

(51) Int. Cl.
| | | |
|---|---|---|
| B05C 21/00 | (2006.01) | |
| H01L 51/56 | (2006.01) | |
| H01L 51/00 | (2006.01) | |
| C23C 14/04 | (2006.01) | |
| C23C 16/04 | (2006.01) | |

(52) U.S. Cl.
CPC ........ *H01L 51/0011* (2013.01); *B05C 21/005* (2013.01); *C23C 14/042* (2013.01); *C23C 16/042* (2013.01); *H01L 51/56* (2013.01)

(58) Field of Classification Search
None
See application file for complete search history.

(56) References Cited

U.S. PATENT DOCUMENTS

2011/0179996 A1* 7/2011 Park .................. C23C 14/042
                                                                118/504
2015/0165464 A1* 6/2015 Baek .................. H01L 51/0011
                                                                118/504

FOREIGN PATENT DOCUMENTS

| KR | 10-1998-0086500 | 12/1998 |
|---|---|---|
| KR | 10-2003-0027167 | 4/2003 |
| KR | 10-2006-0093752 | 8/2006 |
| KR | 10-2007-0002553 | 1/2007 |
| KR | 10-2011-0107045 | 9/2011 |

* cited by examiner

*Primary Examiner* — Jethro M Pence
(74) *Attorney, Agent, or Firm* — H.C. Park & Associates, PLC

(57) ABSTRACT

A mask assembly includes a frame and a mask supported by the frame. The mask includes a plurality of deposition patterns. Each of the plurality of deposition patterns includes a first pattern portion disposed in an active area corresponding to a display area of a display substrate, a second pattern portion disposed in a dummy area corresponding to a non-display area of the display substrate, and a third pattern portion disposed in a dummy outer area also corresponding to the non-display area of the display substrate. The dummy area extends from the active area to the dummy outer area and the dummy outer area extends from the dummy area to an edge of each of the plurality of deposition patterns. The first pattern portion includes a plurality of first holes, the second pattern portion includes a plurality of second holes, and the third pattern portion includes a plurality of grooves.

17 Claims, 12 Drawing Sheets

MASK ASSEMBLY FOR THIN FILM DEPOSITION

CROSS-REFERENCE TO RELATED APPLICATION

This application claims priority from and the benefit of Korean Patent Application No. 10-2015-0184070, filed on Dec. 22, 2015, which is hereby incorporated by reference for all purposes as if fully set forth herein.

BACKGROUND

Field

Exemplary embodiments relate to a mask assembly for depositing a thin film.

Discussion of the Background

Electronic devices, such as mobile phones, notebook computers, personal digital assistants, tablets, are widely used. These devices typically include a display to provide users with visual information, such as an image or video information, in order to support various functions.

An organic light-emitting display apparatus is a self-emitting display element and does not require an additional element to emit light. Further, the organic light-emitting display apparatus provides a wide viewing angle, excellent contrast, and a fast response time. The organic light-emitting display apparatus includes an anode and a cathode, which are disposed on a substrate, and an organic emission layer which is disposed between the anode and the cathode. The organic emission layer may be formed by using a mask for deposition.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask assembly for thin film deposition that provides a precise organic layer on a substrate.

Additional aspects will be set forth in the detailed description which follows, and, in part, will be apparent from the disclosure, or may be learned by practice of the inventive concept.

An exemplary embodiment includes a mask assembly for thin film deposition. The mask assembly includes a frame and a mask supported by the frame. The mask includes a plurality of deposition patterns. Each of the plurality of deposition patterns includes a first pattern portion disposed in an active area corresponding to a display area of a display substrate, a second pattern portion disposed in a dummy area corresponding to a non-display area of the display substrate, and a third pattern portion disposed in a dummy outer area also corresponding to the non-display area of the display substrate. The dummy area extends from the active area to the dummy outer area and the dummy outer area extends from the dummy area to an edge of each of the plurality of deposition patterns. The first pattern portion includes a plurality of first holes, the second pattern portion includes a plurality of second holes, and the third pattern portion includes a plurality of grooves.

An exemplary embodiment also includes a mask for thin film deposition. The mask includes a first pattern portion comprising a plurality of first holes and disposed in an active area corresponding to a display area of a display substrate. The mask also includes a second pattern portion including a plurality of second holes and a plurality of grooves disposed in a dummy area extending from the active area to an edge of the mask. The plurality of second holes is disposed between the plurality of first holes and the plurality of grooves. Each of the plurality of grooves has a minimum width that is less than a minimum width of each of the plurality of first holes and a minimum width of each of the plurality of second holes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
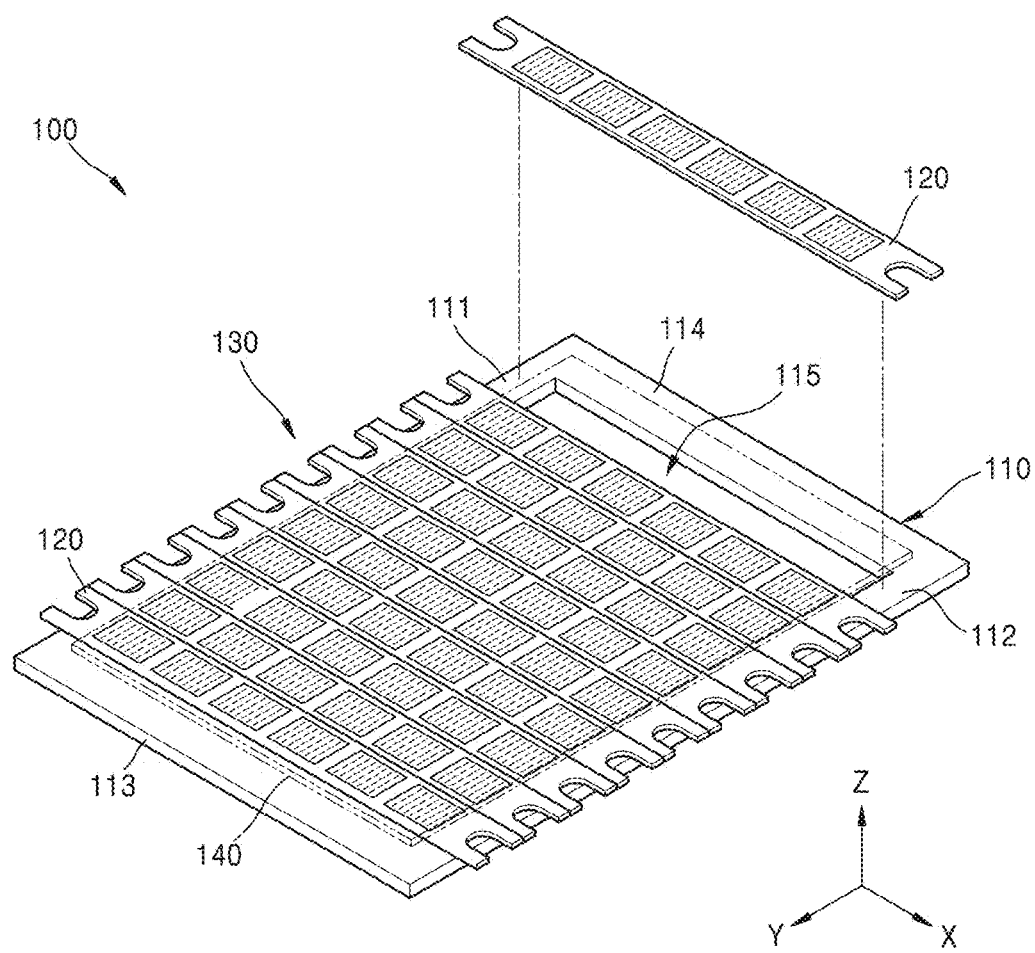
FIG. 1 is a view illustrating a mask assembly for thin film deposition according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first", "second", etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," "including," "contain," and/or "containing," when used in this specification, specify the presence of stated features, integers, steps, operations, elements, components, and/or groups thereof, but do not preclude the presence or addition of one or more other features, integers, steps, operations, elements, components, and/or groups.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Reference will now be made in detail to various exemplary embodiments of a mask assembly for thin film depositions, examples of which are illustrated in the accompanying drawings. Duplicate descriptions of various elements of the various exemplary embodiments will be omitted for brevity.

FIG. 1 is a view illustrating a mask assembly for thin film deposition, according to an exemplary embodiment.

Referring to FIG. 1, the mask assembly 100 may include a frame 110 and a mask 130 having a plurality of sub-masks 120 having an elongated shape.

The frame 110 may include a first part 111, a second part 112, a third part 113, and a fourth part 114. The first, second, third, and fourth parts 111, 112, 113, and 114 of the frame 110 may be connected to each other and define an opening 115. Put another way, the first, second, third, and fourth parts 111, 112, 113, and 114 may surround the opening 115.

The first part 111 and the second part 112 of the frame 110 may face each other in an X direction and extend along a Y direction. The third part 113 and the fourth part 114 of the frame 110 may face each other in the Y direction and extend along the X direction. The first, second, third, and fourth parts 111, 112, 113, and 114 of the frame 110 may form a rectangular frame. The frame 110 may include a material having a low deformability. For example, the frame 110 may include a metal having a high rigidity during the welding process of the mask 130 to the frame 110.

The mask 130 may be disposed over the frame 110. The mask 130 may include at least one of stainless steel, Invar, nickel (Ni), and cobalt (Co). Additionally, the mask 130 may include a nickel alloy or a nickel-cobalt alloy. Regardless of the material used, the mask 130 may be manufactured by using a thin plate.

The mask 130 may include the plurality of sub-masks 120. These sub-masks 120 may be separated from each other in the Y direction to prevent the center of mask without sub-masks from sagging due to gravity. A width of the mask 130 in the Y direction may be less than a length of the mask 130 in the X direction.

The plurality of sub-masks 120 may cover the opening 115. The plurality of sub-mask 120 may be arranged between the third part 113 and the fourth part 114 of the frame 110. Both ends of each of the plurality of sub-masks 120 may be welded on the first part 111 and the second part 112 of the frame 110. In other words, plurality of sub-mask 120 may be fixed to the first part 111 and the second part 112 of the frame 110.

A display substrate 140 may be disposed over the mask 130. An organic emission layer may be formed precisely on the display substrate 140 by increasing a close contact between the mask 130 and the display substrate 140. This precisely formed organic emission layer of the various exemplary embodiments may decrease the occurrence of a shadow in the resulting display device when compared to an organic emission layer formed by conventional means.

Figure 2:
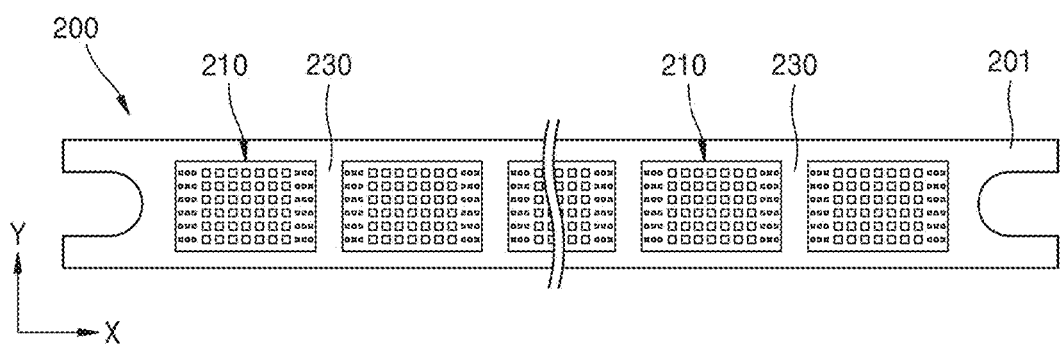
FIG. 2 is a perspective view illustrating a sub-mask according to an exemplary embodiment.
Figure 3:
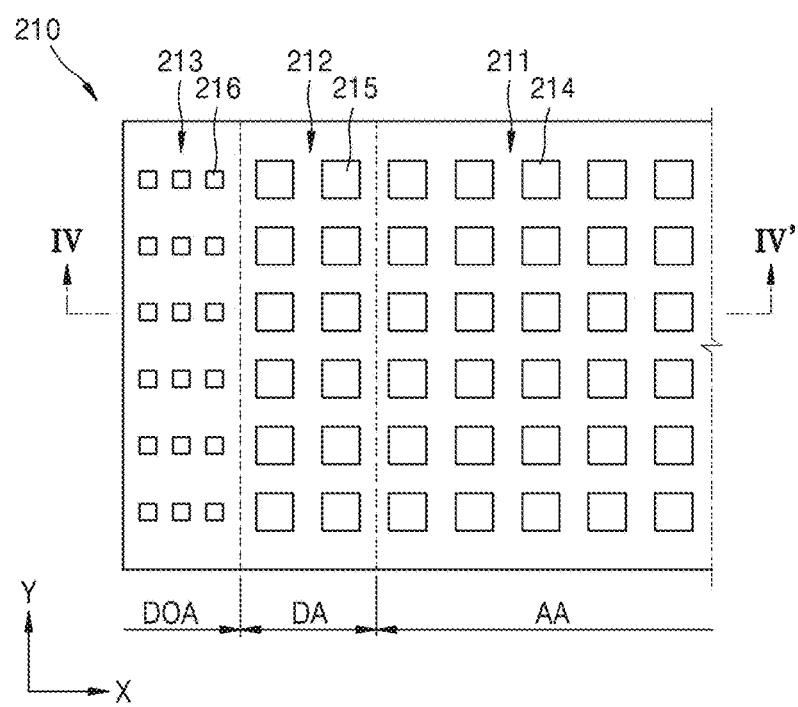
FIG. 3 is an enlarged plan view illustrating a portion of a deposition pattern of FIG. 2.
Figure 4:
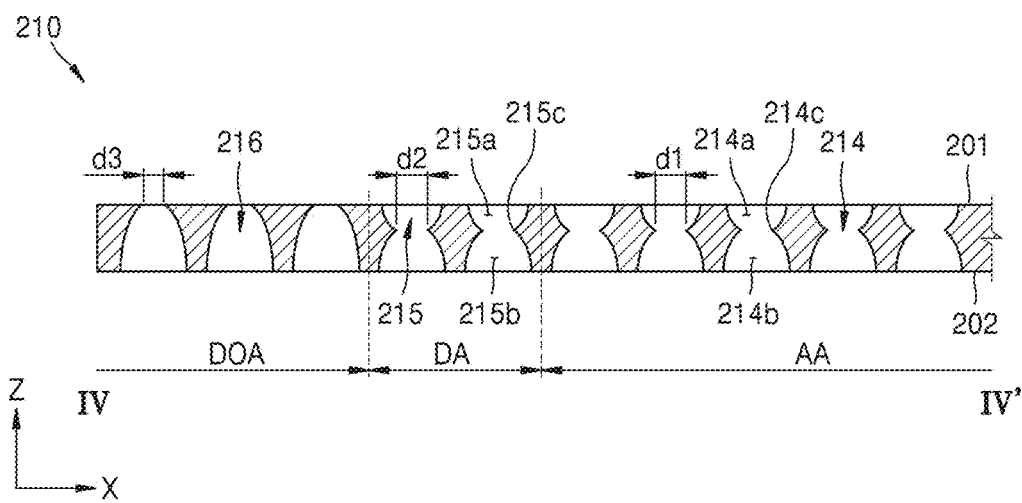
FIG. 4 is a cross-sectional view taken along a sectional line IV-IV' of FIG. 3.

FIG. 2 is a perspective view illustrating a sub-mask 200 according to an exemplary embodiment. FIG. 3 is an enlarged plan view illustrating a portion of a deposition pattern 210 of FIG. 2. FIG. 4 is a cross-sectional view taken along a sectional line IV-IV' of FIG. 3.

Referring to FIGS. 2, 3, and 4, the sub-mask 200 may be a thin metal plate. The sub-mask 200 may include a first surface 201 facing the display substrate 140 of FIG. 1 and a second surface 202 opposite to the first surface 201 and facing away from the display substrate 140. The first surface 201 may contact the display substrate 140. A deposition material may be deposited on the display substrate 140 and through the sub-mask 200 to form a deposition pattern.

The sub-mask 200 may include a plurality of deposition patterns 210. The plurality of deposition patterns 210 may be separated from each other in the X direction. Each of the plurality of deposition patterns 210 may correspond to a display apparatus. For example, each of the plurality of deposition patterns 210 may correspond to a mobile display apparatus and at least some of the deposition patterns 210. Alternatively, the sub-masks 200 including the plurality of deposition patterns 210 or modified deposition patterns 210 (e.g., without the ribs 230 described below or with ribs 230 having a reduced width) may correspond to a large display apparatus.

A rib 230 may be disposed between the each adjacent deposition pattern 210 of the plurality of deposition patterns 210. The rib 230 may connect adjacent deposition patterns 210. The rib 230 may include a dummy deposition pattern (not illustrated). The dummy deposition pattern may include an opening or a half-etched area.

Each of the deposition patterns 210 may include a first pattern portion 211, a second pattern portion 212, and a third pattern portion 213. The first pattern portion 211 may be disposed in an active area AA of the sub-mask and may correspond to a display area of a display substrate such as the display area DSA of FIG. 14. A second pattern portion 212 may be disposed in a dummy area DA extending from the active area AA to a dummy outer area DOA. The dummy area DA may correspond to a non-display area NDSA of a display substrate such as the NDSA of FIG. 14. A third pattern portion 213 may be disposed in the dummy outer area DOA extending from the dummy area DA to the edge of the deposition pattern 210. The dummy outer area DOA may also correspond to the non-display area NDSA of a display substrate such at the NDSA of FIG. 14.

The first pattern portion 211, the second pattern portion 212, and the third pattern portion 213 may be sequentially arranged in the X direction in each of the plurality of deposition patterns 210. The second pattern portion 212 may be disposed between the first pattern portion 211 and the third pattern portion 213. The dummy outer area DOA may contact a rib 230 or an end section of the sub-mask 200.

In an exemplary embodiment, the dummy area DA surrounds the active area AA and the dummy outer area DOA surrounds the dummy area DA.

A plurality of first holes 214 may be disposed in the first pattern portion 211, a plurality of second holes 215 may be disposed in the second pattern portion 212, and a plurality of grooves 216 may be disposed in the third deposition pattern portion 213.

Referring to FIG. 4, each of the plurality of first holes 214 may penetrate the sub-mask 200. Each of the plurality of first holes 214 may be formed by etching the sub-mask 200 from first and second surfaces 201 and 202 of the sub-mask 200. Each of the plurality of first holes 214 may include a first etching portion 214a that may be etched from the first surface 201 by a certain depth. In addition, each of the plurality of first holes 214 may include a second etching portion 214b that is etched from the second surface 202 by a certain depth.

The first etching portion 214a and the second etching portion 214b may penetrate the sub-mask 200. A minimum width d1 of each of the plurality of first holes 214 may correspond to a protrusion 214c where the first etching portion 214a and the second etching portion 214b are connected to each other.

Each of the plurality of second holes 215 may have a same shape as each of the plurality of first holes 214. In particular, each of the plurality of first holes 214 and each of the plurality of second holes 215 may have the same dimension. Thus, similar to the plurality of first holes 214, the plurality of second holes 215 may penetrate the sub-mask 200. Each of the plurality of second holes 215 may include a third etching portion 215a that may be etched from the first surface 201 by a certain depth. In addition each of the plurality of second holes 215 may include a fourth etching portion 215b that may be etched from the second surface 202 by a certain depth. Furthermore, the third etching portion 215a and the fourth etching portion 215b may penetrate the sub-mask 200. A minimum width d2 of each of the plurality of second holes 215 may correspond to a protrusion 215c where the third etching portion 215a and the fourth etching portion 215b are connected to each other. The minimum width d2 of the each of the plurality of second holes 215 may be the same as the minimum width d1 of each of the plurality of first holes 214.

The grooves 216 may be formed by etching the sub-mask 200 from only one of the first surface 201 and the second surface 202. For example, the grooves 216 may be formed by etching only from the second surface 202 but may penetrate an entire width of sub-mask 200 as shown in FIG. 4. In this case, a minimum width d3 may correspond to a width of penetration of the first surface 201 by each of the plurality of the grooves 216. The minimum width d3 of the grooves 216 may be less than the minimum width d1.

The plurality of grooves 216 may be arranged in the same rows as the plurality of first holes 214 and the plurality of second holes 215. These rows are rows extending in the X direction. The grooves 216 may be arranged in different columns from the first holes 214 and the second holes 215, each of the columns corresponding to the Y direction. For example, the first holes 214, the second holes 215, and the grooves 216 may be arranged in a lattice as shown in FIG. 3.

The grooves 216 in the dummy outer area DOA may be simultaneously formed when etching the first holes 214 and the second holes 215 in the active area AA and the dummy area DA. In an exemplary embodiment, the grooves 216 are formed during a second etching process following a first etching process. The first etching process may include simultaneously forming the first etching portions 214a of the first holes 214 and the third etching portions 215a of the second holes 215. The second etching process may include simultaneously forming the second etching portions 214b of the first holes 214 and the fourth etching portions 215b of the second holes 215 after the first etching process.

In summary, the first holes 214 and the second holes 215 may be formed according to a two-step etching process, and the grooves 216 may be formed according to a one-step etching process. Due to the difference in the number of steps for etching the holes 214 and 215, the cross-sectional shapes of the first holes 214 and the second holes 215 may be different from cross-sectional shapes of the grooves 216.

As explained above, the grooves 216 may be formed in the dummy outer area DOA. However, if the grooves 216 are not formed in the dummy outer area DOA of the sub-mask 200, then the second holes 215 of the sub-mask may be over etched. For example, a sub-mask 200 without etched grooves 216 would have a flat surface. When the display substrate 140 is etched through the sub-mask 200 without grooves 216, an etchant disposed on the sub-mask 200 corresponding to the dummy outer area DOA may easily flow toward the dummy area DA of the sub-mask 200 due to the flat surface of the summary outer area DOA portion of the sub-mask. Thus, an etchant that would normally collect and be retained in the grooves 216 may be provided into the second holes 215 of sub-mask 200. Accordingly, the area of the display substrate 140 or elements disposed on the display substrate 140 that corresponds to the dummy area DA of the sub-mask 200 may be excessively etched.

To prevent excessive etching of the area of the display substrate 140 or elements disposed on the display substrate 140 that corresponds to the dummy area DA of the sub-mask 200, the plurality of grooves 216 may be formed in the dummy outer area DOA of the sub-mask 200. For example, when etching the display substrate 140 through the sub-mask 200, the plurality of grooves 216 on the dummy outer area DOA of the sub-mask 200 may prevent an etchant disposed on dummy outer area DOA from easily flowing toward the dummy area DA of the sub-mask 200 by collecting and retaining some or all of the etchant. In essence, the amount of etchant disposed on the dummy area DA of the sub-mask 200, including the etchant directly disposed on the dummy area DA of the sub-mask 200 and the etchant indirectly disposed on the dummy area DA of the sub-mask 200 (i.e., the small amount of etchant, if any, that flows from the outer dummy area DOA of the sub-mask 200), may be similar to the amount of etchant disposed on an active area AA of the sub-mask 200. Thus, the plurality of grooves 216 may reduce the amount of excess etchant provided to the dummy area DA of the sub-mask 200 resulting in similar and desirable etching in the areas of the display substrate 140 that correspond to the dummy area DA and the active area AA of the sub-mask 200. Therefore, elements corresponding to the etched parts of the display substrate 140, such as an organic emission layer, may be precisely formed on the display substrate 140 resulting in improved quality and reliability of the completed display device.

Figure 14:
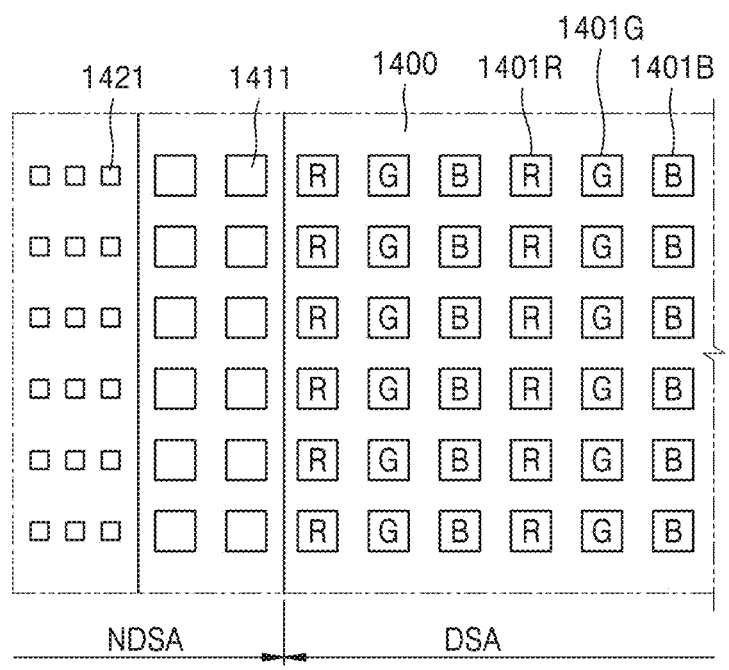
FIG. 14 is a plan view illustrating areas of a display substrate corresponding to a deposition pattern according to an exemplary embodiment.

In summary, since it is possible to form elements of the display substrate 140 corresponding to the second holes 215 with a desirable shape, a portion of the display substrate 140 corresponding to the dummy area DA may be useable as a display area (see DSA in FIG. 14). Accordingly, the second holes 215 may be used to form an organic emission layer that is disposed in the display area of the display substrate 140.

Figure 5:
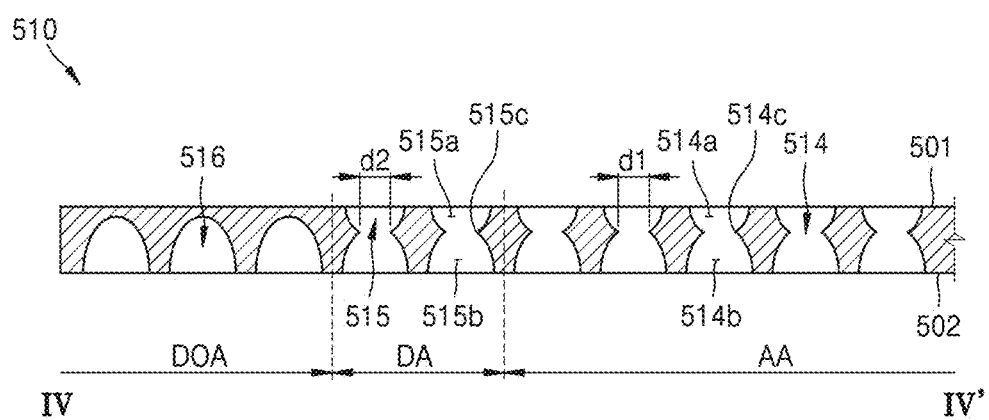
FIG. 5 is a cross-sectional view illustrating a modified deposition pattern of FIG. 2 according to an exemplary embodiment.

FIG. 5 is a cross-sectional view illustrating a modified deposition pattern of FIG. 2 according to an exemplary embodiment.

Referring to FIG. 5, a modified deposition pattern 510 of a sub-mask 200 may include a plurality of first holes 514 disposed in an active area AA, a plurality of second holes 515 disposed in a dummy area DA, and a plurality of grooves 516 disposed in a dummy outer area DOA.

Each of the first holes 514 may include a first etching portion 514a that is etched from a first surface 501 of a sub-mask 200, and a second etching portion 514b that is etched from a second surface 502 of the sub-mask 200. A minimum width d1 of each of the plurality of the first holes 514 may correspond to a protrusion 514c where the first etching portion 514a and the second etching portion 514b are connected to each other.

Each of the plurality of second holes 515 may include a third etching portion 515a that is etched from the first surface 501 and a fourth etching portion 515b that is formed by etching from the second surface 502. A minimum width d2 of each of the plurality of second holes 515 may correspond to a protrusion 515c where the third etching portion 515a and the fourth etching portion 515b are connected to each other. The minimum width d2 of each of the plurality of second holes 515 may be the same as the minimum width d1 of each of the plurality of first holes 514.

The grooves 516 may be etched only from the second surface 502. According to an exemplary embodiment, the grooves 516 may not penetrate an entire depth of the modified sub-mask 200. Each of the plurality of grooves 516 may be a recess having a certain depth in the sub-mask and does not penetrate the first surface 501. Thus, a minimum width of each of the plurality of grooves 516 may be zero since it does not penetrate the entire depth modified sub-mask.

Figure 6:
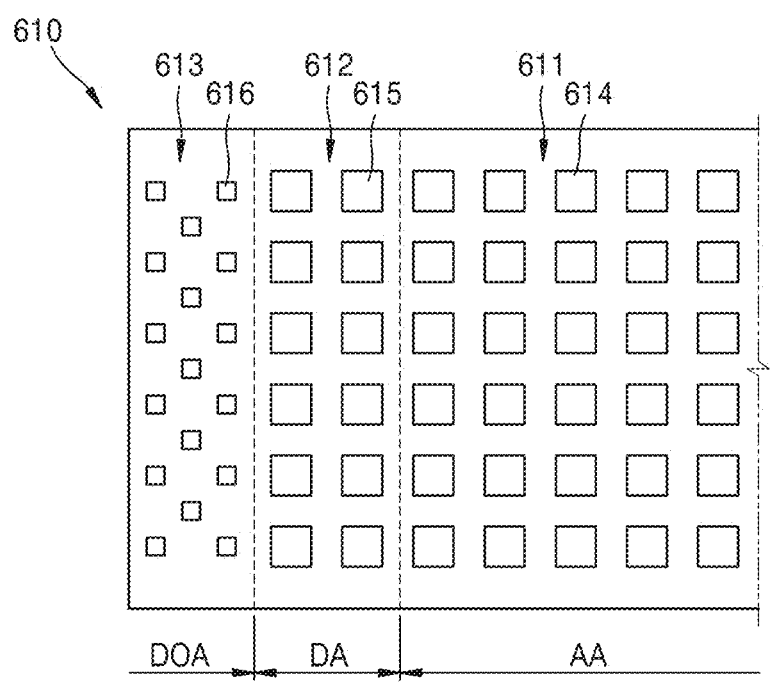
FIG. 6, FIG. 7, and FIG. 8 are enlarged plan views illustrating deposition patterns according to various exemplary embodiments.
Figure 7:
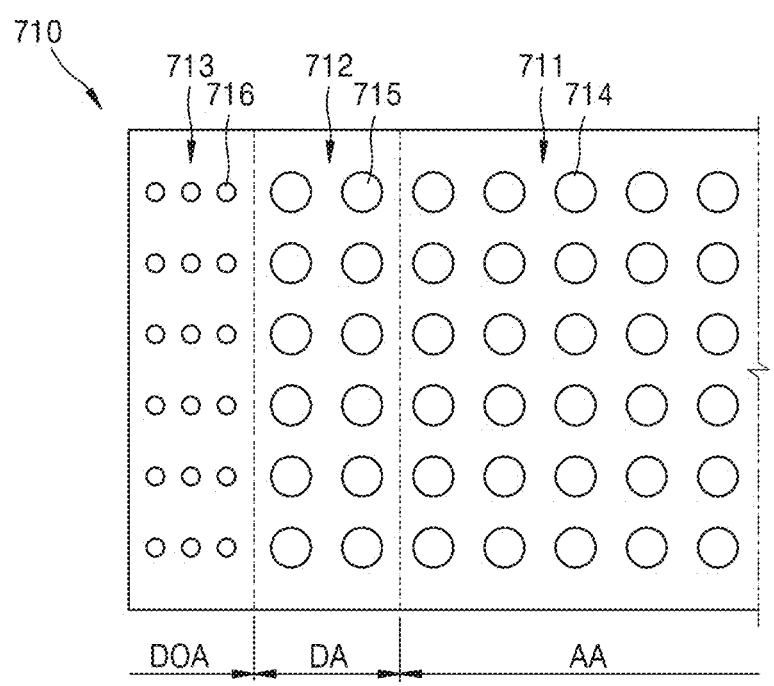
Figure 8:
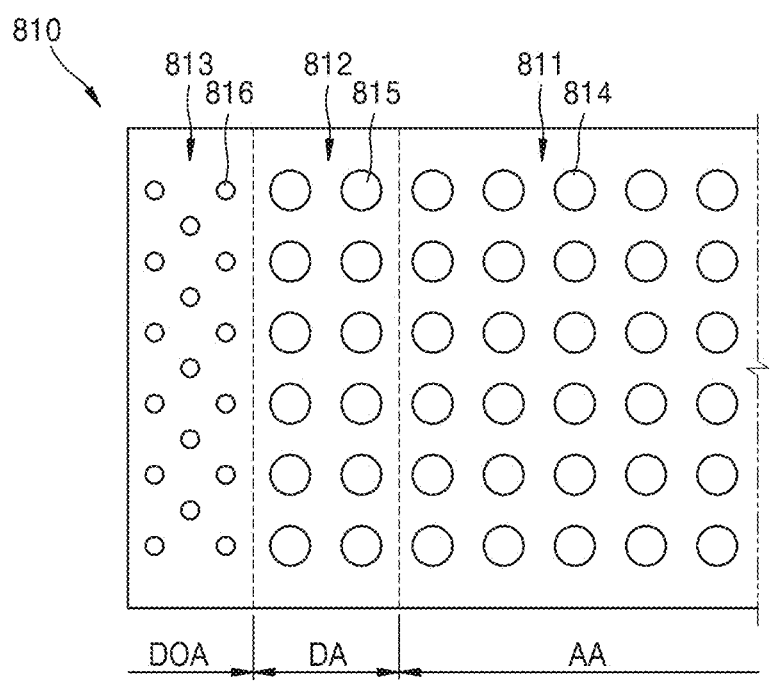

FIG. 6, FIG. 7, and FIG. 8 are enlarged plan views illustrating deposition patterns 610, 710, and 810 according to various exemplary embodiments.

Referring to FIG. 6, the deposition pattern 610 of the modified sub-mask 200 may include a first deposition portion 611 disposed in an active area AA, a second pattern portion 612 disposed in a dummy area DA, and a third pattern portion 613 disposed in a dummy outer area DOA.

A plurality of first holes 614 may be disposed in the first pattern portion 611, a plurality of second holes 615 may be disposed in the second pattern portion 612, and a plurality of grooves 616 may be disposed in the third pattern portion 613.

According to an exemplary embodiment, first grooves of the plurality of grooves 616 are arranged in same rows with the first holes 614 and the second holes 615 and second grooves of the grooves 616 are arranged in different rows from the first holes 614. The grooves disposed in different rows may be alternately arranged from each other. In an exemplary embodiment, the plurality of grooves 616 are arranged in a zigzag pattern while the plurality of first holes 614 and the plurality of second holes 615 are arranged in a lattice. Put another way, some grooves 616 may be offset from the lattice pattern of the other plurality of grooves 616 and the plurality of first holes 614 and the plurality of second holes 615. These offset grooves may be disposed between the defined rows of the plurality of first holes and the plurality of second holes 215.

Each of the plurality of grooves 616 may have a rectangular shape (e.g., a square). Each of the plurality of grooves 616 may be any polygon including a polygon shape that is different from a rectangle such as a hexagon, octagon, or a trapezoid.

Referring to FIG. 7, the deposition pattern 710 may include a first pattern portion 711, a second pattern portion 712, and a third pattern portion 713 which are sequentially arranged. The first pattern portion 711 may include a plurality of first holes 714, the second pattern portion 712 may include a plurality of second holes 715, and the third pattern portion 713 may include a plurality of grooves 716.

The arrangement of the plurality of grooves 716 may be the same as or similar to the arrangement of the first holes 714 or the first holes 214 of FIG. 3. However, each of the plurality of grooves 616 may have a circular shape. Alternatively, each of the plurality of grooves 616 may have any other curved non-polygonal shape such as an ellipse.

Referring to FIG. 8, the deposition pattern 810 may include a first pattern portion 811, a second pattern portion 812, and a third pattern portion 813 that are sequentially arranged in a lengthwise direction of a modified sub-mask 200. The first pattern portion 811 may include a plurality of first holes 814, the second pattern portion 812 may include a plurality of second holes 815, and the third pattern portion 813 may include a plurality of grooves 816.

The plurality of grooves 816 may be arranged similarly or identical to the plurality of grooves 616 of FIG. 6. However, each of the plurality of grooves 816 may have a non-polygonal shape such as a circle or an ellipse as described with reference to FIG. 7.

Figure 9:
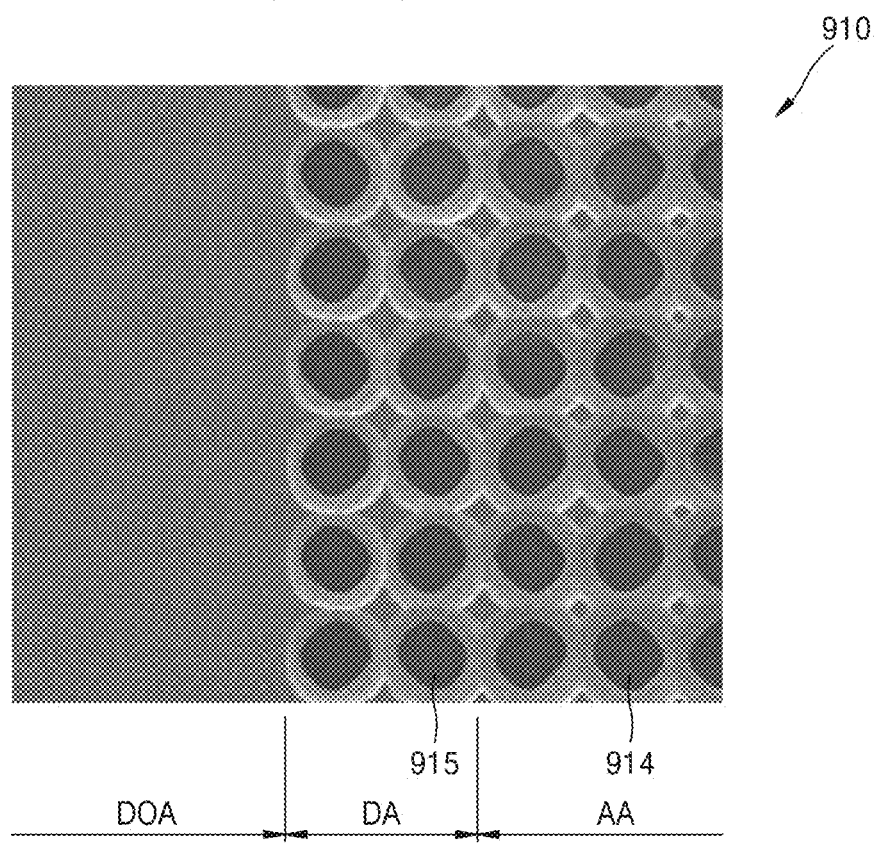
FIG. 9 is an enlarged image of a deposition pattern of a comparative example.
Figure 10:
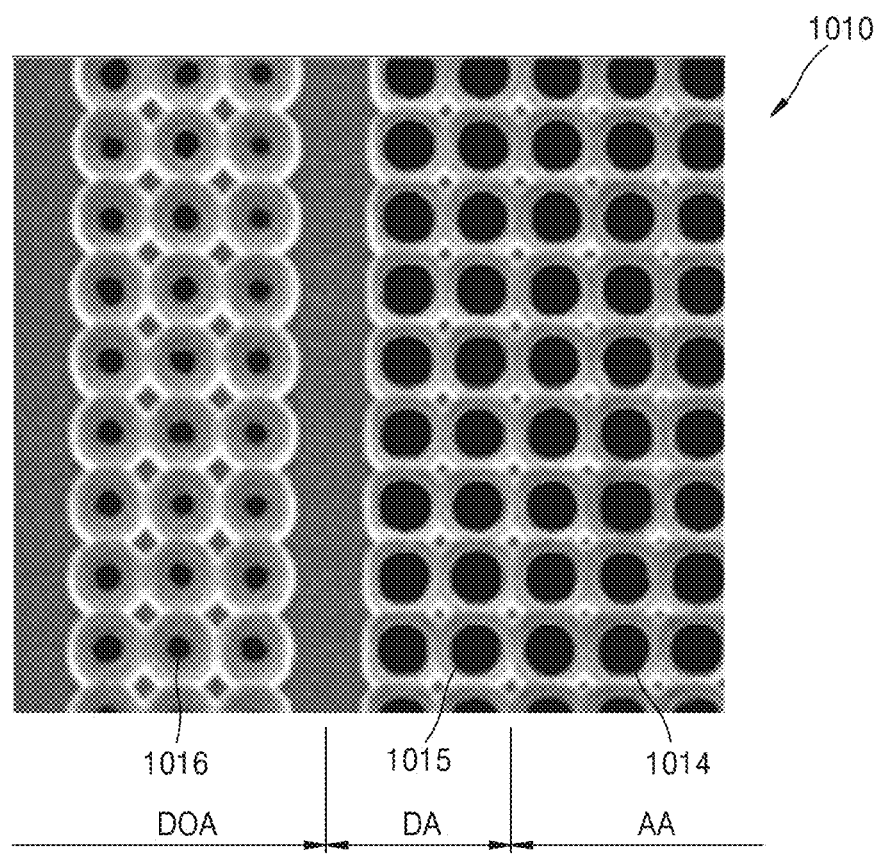
FIG. 10 is an enlarged image of a deposition pattern according to an exemplary embodiment.

FIG. 9 is an enlarged image of a deposition pattern of a comparative example. FIG. 10 is an enlarged image of a deposition pattern according to an exemplary embodiment.

Referring to FIG. 9, a deposition pattern 910 of a comparative example may include a plurality of first holes 914 disposed in an active area AA and a plurality of second holes 915 disposed in a dummy area DA. However, the deposition pattern 910 of the comparative example does not include a groove disposed in a dummy outer area DOA. Furthermore, each of the plurality of the first holes 914 and each of the plurality of second holes 915 have a circular shape.

Referring to FIG. 10, the deposition pattern 1010 of an exemplary embodiment includes a plurality of first holes 1014 disposed in an active area AA, a plurality of second holes 1015 disposed in a dummy area DA, and a plurality of grooves 1016 disposed in a dummy outer area DOA. Each of the plurality of the first holes 1014 and each of the plurality of second holes 1015 have a circular shape and each of the plurality of grooves 1016 have a minimum width of that is less than a minimum width of each of plurality of first holes 1014.

Figure 11:
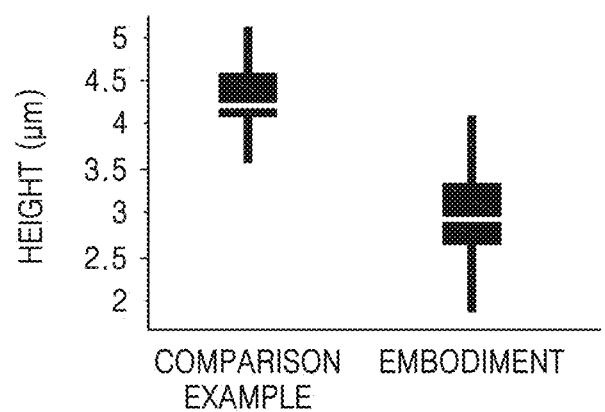
FIG. 11 is a graph illustrating a depth of a protrusion of the second hole of the comparative example of FIG. 9 and a depth of a protrusion of the second hole of the exemplary embodiment of FIG. 10.

FIG. 11 is a graph illustrating a depth of a protrusion of the second hole of the comparative example and a depth of a protrusion of the second hole of exemplary embodiment of FIG. 10.

Here, the protrusion may correspond to a portion where a third etching portion (see third etching portion 215a of sub-mask 200 of FIG. 4) and a fourth etching portion (see fourth etching portion 215b of FIG. 4) are connected to each other. The depth of the protrusion may correspond to a distance (i.e., a depth) between the protrusion and a first surface of a sub-mask (see first surface 201 of FIG. 4).

Referring to the comparative example of FIG. 11, each of the plurality of protrusions of each of the plurality of second holes 915 has a maximum depth equal to 5.08 µm. In addition, each of the plurality of protrusions of each of the plurality of second holes 915 equal has a minimum depth to 3.58 µm. Moreover, each of the plurality of protrusions of each of the plurality of second holes 915 has an average depth equal to 4.32 µm.

Referring to the exemplary embodiment of FIG. 11, each of the plurality of protrusions of each the plurality of second holes 1015 has a maximum depth of about 4.24 µm. In addition, each of the plurality of protrusions of each of the plurality of second holes 1015 has a minimum depth of about 1.88 µm and an average height of about 2.9 µm.

When the depth of the protrusion is reduced, a shadow area of the sub-mask is reduced thereby improving the quality of a deposition pattern. For example, an organic emission layer of a substrate may be precisely formed when using a deposition pattern having a plurality of second holes with protrusions having a reduced depth. According to the exemplary embodiment, the minimum depth, average depth, and maximum depth of each of the plurality of protrusions of each of the plurality of second holes 1015 is less than the corresponding minimum depth, average depth, and maximum depth of each of the plurality of protrusions of the plurality of second holes 915. Accordingly, the exemplary embodiment has a plurality of second holes 1015 of higher quality than a plurality of second holes 915 of the comparative example.

Figure 12:
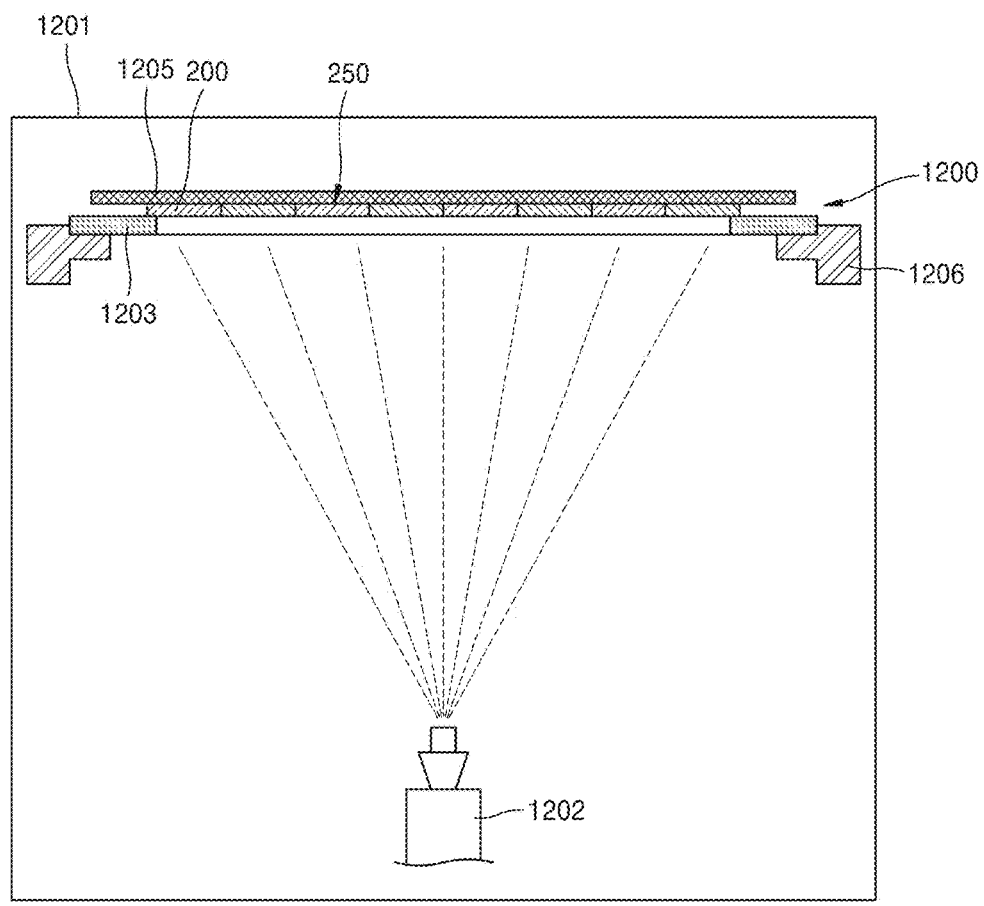
FIG. 12 is a diagram illustrating a deposition of a thin film on a substrate by using a mask assembly according to an exemplary embodiment.

FIG. 12 is a diagram illustrating deposition of a thin film on a substrate by using a mask assembly according to an exemplary embodiment.

Referring to FIG. 12, a vacuum chamber 1201 is provided for the depositing a thin film on a deposition substrate 1205 with a mask assembly 1200.

A deposition source 1202 may be disposed at a bottom portion of the vacuum chamber 1201. The mask assembly 1200 may be disposed at a top portion of the vacuum chamber 1201. The mask assembly 1200 may include a frame 1203 and a mask 250 including the plurality of sub-masks 200, as illustrated in FIG. 2. The mask 250 may be disposed over a frame 1203. A deposition substrate 1205 may be disposed over the mask 250. A support 1206 may be further provided at a boundary of the mask assembly 1200 to secure the mask assembly 1200.

When a deposition material is discharged from the deposition source 1202 toward the mask assembly 1200, the deposition material may pass through any one of the deposition patterns 210, 510, 610, 710, or 810, of the plurality of sub-masks 200 or modified sub-marks. Thus, the deposition material may be disposed on a surface of the deposition substrate 1205.

Figure 13:
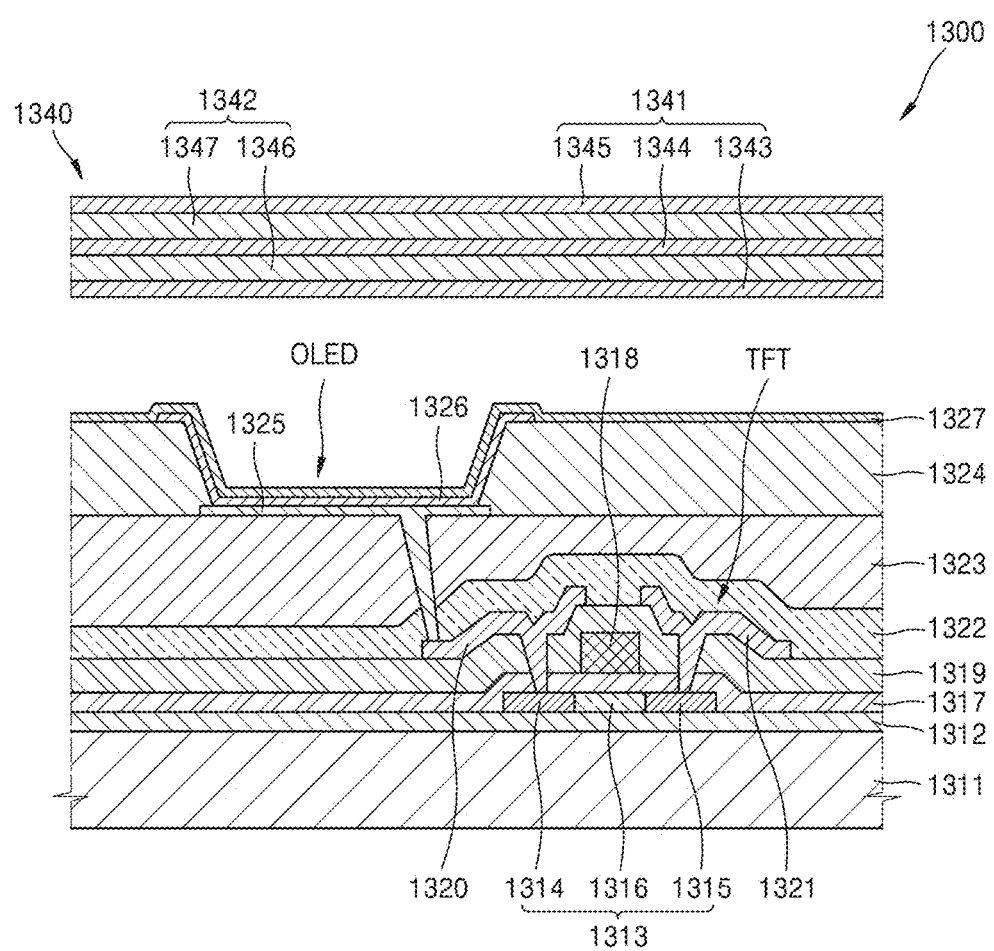
FIG. 13 is a cross-sectional view illustrating an exemplary embodiment of a sub-pixel of an organic light-emitting display apparatus.

FIG. 13 is a cross-sectional view illustrating an exemplary embodiment of a sub-pixel of an organic light-emitting display apparatus.

Referring to FIG. 13, the sub-pixel may include at least one thin film transistor TFT and an organic light-emitting device OLED. However, the thin film transistor TFT is not limited the structure illustrated in FIG. 13. Thus, the number and structure of the thin film transistors may vary without departing form the spirit and scope of the present invention.

The organic light-emitting display apparatus 1300 may include a display substrate 1311 and a thin film encapsulation layer 1340 disposed over the display substrate 1311.

The display substrate 1311 may include at least one of a glass substrate and a polymer substrate. The display substrate 1311 may be at least one of transparent, semitransparent, and translucent.

A buffer film 1312 may be disposed over the display substrate 1311. The buffer film 1312 may cover the entirety of an upper surface of the display substrate 1311. The buffer film 1312 may include at least one of an inorganic film and an organic film. The buffer film 1312 may include a single layer film or a multilayer film.

The thin film transistor TFT may be disposed over the buffer film 1312.

A semiconductor active layer 1313 may be disposed over the buffer film 1312.

The semiconductor active layer 1313 may include a source region 1314 and a drain region 1315 that are formed by doping the semiconductor active layer 1313 with N-type impurity ions or P-type impurity ions. A channel region 1316 may be formed in an area of the semiconductor active layer 1313 between the source region 1314 and the drain region 1315 without doping with impurities. The semiconductor active layer 1313 may include at least one of an organic semiconductor and an inorganic semiconductor such as amorphous silicon. In another exemplary embodiment, the semiconductor active layer 1313 may include an oxide semiconductor such as a zinc-oxide based semiconductor.

A gate insulation film 1317 may be deposited over the semiconductor active layer 1313. The gate insulation film 1317 may include an inorganic film. The gate insulation film 1317 may be a single film or multilayer film.

A gate electrode 1318 may be disposed over the gate insulation film 1317. The gate electrode 1318 may include a metal material having a high conductivity. The gate electrode 1318 may include a single film or a multilayer film.

An interlayer insulation film 1319 may be disposed on the gate electrode 1318. The interlayer insulation film 1109 may include at least one of an inorganic film and an organic film.

A source electrode 1320 and a drain electrode 1321 may be disposed over the interlayer insulation film 1319. A plurality of contact holes may be formed in the interlayer insulation film 1319 and the gate insulation film 1317 by selectively removing portions of the gate insulation film 1317 and the interlayer insulation film 1319. The source electrode 1320 may contact and be electrically connected to the source region 1314 of the semiconductor active layer 1313 though a contact hole. The drain electrode 1321 may contact and be electrically connected to the drain region 1315 of the semiconductor active layer 1313.

A passivation film 1322 may be disposed over the source electrode 1320 and the drain electrode 1321. The passivation film 1322 may include at least one of an inorganic film and an organic film. A planarization film 1323 may be disposed over the passivation film 1322. The planarization film 1323 may include an organic film. In an exemplary embodiment, one of the passivation film 1322 and the planarization film 1323 may be omitted.

The thin film transistor TFT may be electrically connected to the organic light-emitting device OLED.

The organic light-emitting device OLED may be disposed over the planarization film 1323. The organic light-emitting device OLED may include a first electrode 1325, an intermediate layer 1326, and a second electrode 1327.

The first electrode 1325 may function as an anode and may include various conductive elements. The first electrode 1325 may include a transparent electrode or a reflective electrode. For example, when the first electrode 1325 includes the transparent electrode, the first electrode 1325 may include a transparent conductive film. When the first electrode 1325 includes the reflective electrode, the first electrode 1325 may include a reflective film and a transparent film disposed over the reflective film.

A pixel defining film 1324 may cover the planarization film 1323. The pixel defining film 1324 may cover at least a portion of the first electrode 1325. The pixel defining film 1324 may define a light-emitting region of each of a plurality of sub-pixels by surrounding an edge of the first electrode 1325. The first electrode 1325 may be patterned in each of the plurality of sub-pixels.

The pixel defining film 1324 may include at least one of an organic film and an inorganic film. The pixel defining film 1324 may include a single film or a multilayer film.

The intermediate layer 1326 may be disposed on the first electrode 1325 in an area which is exposed by etching a portion of the pixel defining film 1324. The intermediate layer 1326 may be formed by a deposition process using a mask assembly described with reference to FIGS. 1, 2, 3, 4, 5, 6, 7, and 8.

The intermediate layer 1326 may include an organic emission layer. The intermediate layer 1326 may include an organic emission layer and at least one of various functional layers. For instance, the intermediate layer 1326 may further include at least one of a hole injection layer (HIL), a hole transport layer (HTL), an electron transport layer (ETL), and an electron injection layer (EIL).

The second electrode 1327 may be disposed over the intermediate layer 1326.

The second electrode 1327 may function as a cathode. The second electrode 1327 may include a transparent electrode or a reflective electrode. For example, when the second electrode 1327 includes the transparent electrode, the second electrode 1327 may include a metal film and a transparent conductive film disposed over the metal film. When the second electrode 1327 includes the reflective electrode, the second electrode 1327 may include a metal film.

A plurality of sub-pixels may be disposed over the display substrate 1311, and each of the plurality of sub-pixels may realize red, green, blue, or white light.

The thin film encapsulation layer 1340 may cover the organic light-emitting device OLED.

The encapsulation layer 1340 may include at least one of an inorganic film 1341 and an organic film 1342 that are alternately stacked over the organic light-emitting device OLED. For example, a first inorganic film 1343, a second inorganic film 1344, and a third inorganic film 1343, a first organic film 1346, and a second organic film 1347 may be alternately stacked.

FIG. 14 is a plan view illustrating areas of a display substrate corresponding to a deposition pattern according to an exemplary embodiment.

Referring to FIG. 14, the display substrate 1400 may include a display area DSA corresponding to the active area AA of the deposition pattern 210, 510, 610, or 810 to display an image and a non-display area NDSA disposed in an area different from the display area DSA. The display area NDSA may correspond to the dummy area DA and the dummy outer area DOA of the deposition pattern 210, 510, 610, or 810.

At least one deposition material may be disposed on a display area DSA of the display substrate 1400 to form a red emission layer 1401R, a green emission layer 1401G, and a blue emission layer 1401B by passing through a plurality of first holes in the sub-mask of deposition pattern 210, 510, 610, 710, or 810 (see e.g., 214 in FIG. 2). Each of the red emission layer 1401R, the green emission layer 1401G, and the blue emission layer 1401B may be disposed or otherwise formed as an organic emission layer of a sub-pixel, or be provided as a component of the intermediate layer 1326 of FIG. 13.

At least one deposition material may be disposed on a non-display area NDSA of the display substrate 1400 by passing through a plurality of second holes (see e.g., 215 in FIG. 2). The first organic layer 1411 may be used as an organic emission layer according to a design preference of the display substrate 1400.

A at least one deposition material may be disposed on an edge of the non-display area NDSA of the display substrate 1400 to form a second organic layer 1421 that passes through grooves (see e.g., 216 in FIG. 2). The second organic layer 1421 and the first organic layer 1411 may be patterned to have the same shape as the red emission layer 1401R, the green emission layer 1401G, and the blue emission layer 1401B. However, the second organic layer 1421 may be patterned to be smaller than the first organic layer 1411 and the emission layers 1401 as shown in FIG. 14.

According to various exemplary embodiments, a mask assembly for thin film deposition includes a plurality of grooves disposed in a dummy outer area, and holes disposed in a dummy area and an active area. Elements of a display substrate corresponding to the holes in the dummy area may be precisely formed due to the grooves disposed in the dummy outer area. Therefore, a mask assembly that precisely disposes elements is provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask assembly for thin film deposition, comprising:
    a frame; and
    a mask supported by the frame and comprising a plurality of deposition patterns, each of the plurality of deposition patterns comprising:
        a first pattern portion disposed in an active area corresponding to a display area of a display substrate;
        a second pattern portion disposed in a dummy area corresponding to a non-display area of the display substrate; and
        a third pattern portion disposed in a dummy outer area also corresponding to the non-display area of the display substrate,
    wherein the dummy area extends from the active area to the dummy outer area and the dummy outer area extends from the dummy area to an edge of each of the plurality of deposition patterns,
    wherein the first pattern portion comprises a plurality of first holes, the second pattern portion comprises a plurality of second holes, and the third pattern portion comprises a plurality of grooves, each of the plurality of grooves penetrating the mask,
    wherein the mask comprises a first surface facing the display substrate and a second surface facing away from the display substrate,
    wherein each of the plurality of first holes and each of the plurality of second holes are simultaneously etched from the first surface,
    wherein each of the plurality of first holes and each of the plurality of second holes are simultaneously etched from the second surface,
    wherein each of the plurality of grooves is etched only from the second surface, and
    wherein a minimum width of each of the plurality of grooves is less than a minimum width of each of the plurality of first holes.

2. The mask assembly of claim 1, wherein the first surface contacts the display substrate for the thin film deposition.

3. The mask assembly of claim 1, wherein the minimum width of each of the plurality of grooves corresponds to a penetration of the first surface of the mask by each of the plurality of grooves.

4. The mask assembly of claim 1, wherein the plurality of grooves are recessed in the mask and do not penetrate the first surface of the mask.

5. The mask assembly of claim 1, wherein:
    each of the plurality of first holes comprise a first etching portion etched from the first surface of the mask and a second etching portion etched from the second surface of the mask, and
    the first etching portion and the second etching portion penetrate an entire depth of the mask.

6. The mask assembly of claim 5, wherein the minimum width of each of the plurality of first holes corresponds to a protrusion portion where the first etching portion and the second etching portion are connected to each other.

7. The mask assembly of claim 5, wherein each of the plurality of first holes and each of the plurality of second holes comprise a same shape.

8. The mask assembly of claim 5, wherein:
    each of the plurality of second holes comprise a third etching portion etched from the first surface and a fourth etching portion etched from the second surface, and
    the third etching portion and the fourth etching portion penetrate the entire depth of the mask.

9. The mask assembly of claim 8, wherein a minimum width of each of the plurality of second holes corresponds to a protrusion portion where the third etching portion and the fourth etching portion are connected to each other.

10. The mask assembly of claim 1, wherein:
    each of the plurality of deposition patterns is separately disposed and arranged in a first direction having a plurality of ribs disposed between adjacent deposition patterns of the plurality of deposition patterns,
    the first pattern portion, the second pattern portion, and the third pattern portion are continuously arranged in a second direction crossing the first direction, and
    the dummy outer area contacts a rib, among the plurality of ribs, disposed between the dummy outer area and the dummy area of the mask.

11. The mask assembly of claim 1, wherein the plurality of grooves, the plurality of first holes, and the plurality of second holes are arranged in corresponding rows.

12. The mask assembly of claim 11, wherein the plurality of grooves comprise:
    first grooves arranged in the corresponding rows with the plurality of first holes and the plurality of second holes,
    second grooves arranged in different rows from the plurality of first holes and the plurality of second holes, and
    the first grooves and the second grooves are arranged in different columns.

13. The mask assembly of claim 1, wherein:
    the plurality of first holes and the plurality of second holes are arranged in a lattice, and
    at least some grooves among the plurality of grooves are arranged in a zigzag pattern.

14. The mask assembly of claim 1, wherein each of the plurality of grooves comprise at least one of a non-polygonal shape and a polygonal shape.

15. The mask of claim 1, wherein:
each of the plurality of second holes and each of the plurality of first holes have a same shape, and
each of the plurality of grooves has a different shape than the plurality of second holes.

16. The mask of claim 1, wherein the minimum width of the plurality of grooves is less than a minimum width of each of the plurality of second holes.

17. The mask of claim 16, wherein each of the plurality of second holes comprises a same shape as each of the plurality of first holes.

* * * * *